US012622289B2

(12) United States Patent
Wei

(10) Patent No.: US 12,622,289 B2
(45) Date of Patent: May 5, 2026

(54) DOUBLE-SIDED LAMINATE PACKAGE WITH 3D INTERCONNECTION STRUCTURE

(71) Applicant: pSemi Corporation, San Diego, CA (US)

(72) Inventor: Yuan Wei, Arlington Heights, IL (US)

(73) Assignee: PSEMI CORPORATION, San Diego, CA (US)

( * ) Notice: Subject to any disclaimer, the term of this patent is extended or adjusted under 35 U.S.C. 154(b) by 628 days.

(21) Appl. No.: 18/056,564

(22) Filed: Nov. 17, 2022

(65) Prior Publication Data

US 2024/0170407 A1 May 23, 2024

(51) Int. Cl.
*H01L 23/538* (2006.01)
*H01L 23/00* (2006.01)
*H01L 25/10* (2006.01)

(52) U.S. Cl.
CPC .......... *H01L 23/5384* (2013.01); *H01L 24/05* (2013.01); *H01L 24/13* (2013.01); *H01L 25/105* (2013.01); *H01L 2224/0401* (2013.01); *H01L 2224/05022* (2013.01); *H01L 2224/13009* (2013.01); *H01L 2924/14215* (2013.01)

(58) Field of Classification Search
CPC .................................................. H01L 23/5384
See application file for complete search history.

(56) References Cited

U.S. PATENT DOCUMENTS

| | | | |
|---|---|---|---|
| 8,432,033 B2 | 4/2013 | Shinohara | |
| 9,617,148 B2 | 4/2017 | Ma et al. | |
| 9,917,104 B1 | 3/2018 | Roizin et al. | |
| 11,349,506 B2 | 5/2022 | Uejima | |
| 11,349,511 B2 | 5/2022 | Sawada et al. | |
| 2011/0037170 A1* | 2/2011 | Shinohara | H01L 25/16 |
| | | | 257/737 |
| 2022/0102296 A1 | 3/2022 | Kitajima | |

FOREIGN PATENT DOCUMENTS

JP 2022096837 A 6/2022

OTHER PUBLICATIONS

International Search Report and Written Opinion for International Application No. PCT/US2023/078165 filed on Oct. 30, 2023 on behalf of Psemi Corporation Mail Date: Feb. 22, 2024 10 pages.

* cited by examiner

*Primary Examiner* — William A Harriston
(74) *Attorney, Agent, or Firm* — Steinfl + Bruno LLP

(57) ABSTRACT

Methods and devices for implementing vias as third-dimension connections in double-sided laminate packages for RF front-end circuits are disclosed. The described methods and devices are based on implementing components of an electronic module in two different integrated circuits and dispose the two integrated circuits on the opposite side of an isolating laminate. The components within one integrated circuit can be coupled to the components on the other integrated circuit by creating vias inside the laminate.

22 Claims, 8 Drawing Sheets

100

DOUBLE-SIDED LAMINATE PACKAGE WITH 3D INTERCONNECTION STRUCTURE

TECHNICAL FIELD

The present disclosure is related to double-sided laminate packages, more in particular to methods and devices for implementing vias as third dimension connections in double-sided laminate packages, such as double-sided laminate packages in radio frequency (RF) front-end modules of mobile communication devices.

BACKGROUND

In a regular assembly process of integrated circuits for RF front-end modules of mobile communication devices, single-sided laminate packaging may be implemented. In such approach, the integrated circuit (IC) of interest is disposed on one side of the laminate while the other side is mostly used for connecting to the printed circuit board (PCB).

FIG. 1 shows a prior art antenna switch (ASW, 100) implemented as part of a radio frequency (RF) front-end module of a mobile communication device. ASW (100) represents a three-pole n-throw ASW implemented in a planar structure. Such ASW includes antenna rails (R1, R2, R3), a first set of switches (S11, . . . , S1n) coupling first rail (R1) to IC bumps (A1, . . . , An), a second set of switches (S21, . . . , S2n) coupling antenna rail (R2) to IC bumps (B1, . . . Bn), and a third set of switches (S31, . . . , S3n) coupling antenna rail (R3) to IC bumps (B1, . . . , Bn). The ASW structure relies on planar IC metal layers and laminate traces to provide interconnections. As shown, metal traces (W1, . . . , Wn) connect transmit bumps (A1, . . . , An) to transmit bumps (B1, . . . , Bn), and such connections enable the coupling of rail (R1) to bumps (B1, . . . , Bn).

There are several drawbacks associated with the planar structure of FIG. 1:

IC metal overlap and the coupling between adjacent routings make isolation requirements difficult to meet;

Input/output (I/O) allocations are not flexible and this often results in prohibitively long laminate traces; and ASWs with higher number of poles (e.g. four or more) are very challenging to design.

The above-mentioned issues pose challenges on the overall design of an RF front-end module.

SUMMARY

The disclosed teachings address the above-mentioned challenges. The described methods and devices implement vias as third dimension connections, which greatly improve routing flexibility and make use of mid-layer ground as free shielding. The disclosed methods allow a more flexible design of I/O arrangements. This effectively means shorter interconnections on the module, and thus improved insertion losses and lower overall parasitic capacitances.

According to a first aspect of the present disclosure, an electronic module is provided, comprising: a laminate having a first side and a second side, the second side being opposite to the first side, the laminate being made of a dielectric material; first side metal traces disposed on the first side of the laminate and second side metal traces disposed on the second side of the laminate; a first integrated circuit (IC) comprising a plurality of first side IC bumps; the first IC being disposed along a first plane and coupled to the first side metal traces via the plurality of first side IC bumps;

a second IC comprising a plurality of second side IC bumps; the second IC being disposed along a second plane and coupled to the second side metal traces via the plurality of second side IC bumps; and a plurality of vias disposed inside the laminate, wherein: each via of the plurality of vias connects a first side IC bump of the plurality of first side IC bumps to a corresponding second side IC bump of the plurality of second side IC bumps.

According to a second aspect of the present disclosure, a method of three-dimensionally connecting electronic components of an electronic module is disclosed, the method comprising: providing a first and a second integrated circuit (IC), each IC including electronic components and IC bumps; providing a laminate with a first side and a second side, the laminate having metal traces on each of the first side and the second side; using the IC bumps of the first IC to electrically connecting the first IC to the metal traces of the first side of the laminate; using the IC bumps of the second IC to electrically connecting the second IC to the metal traces of the second side of the laminate, and disposing vias inside the laminate to electrically connect the IC bumps of the first IC to the IC bumps of the second IC.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Figure 1:
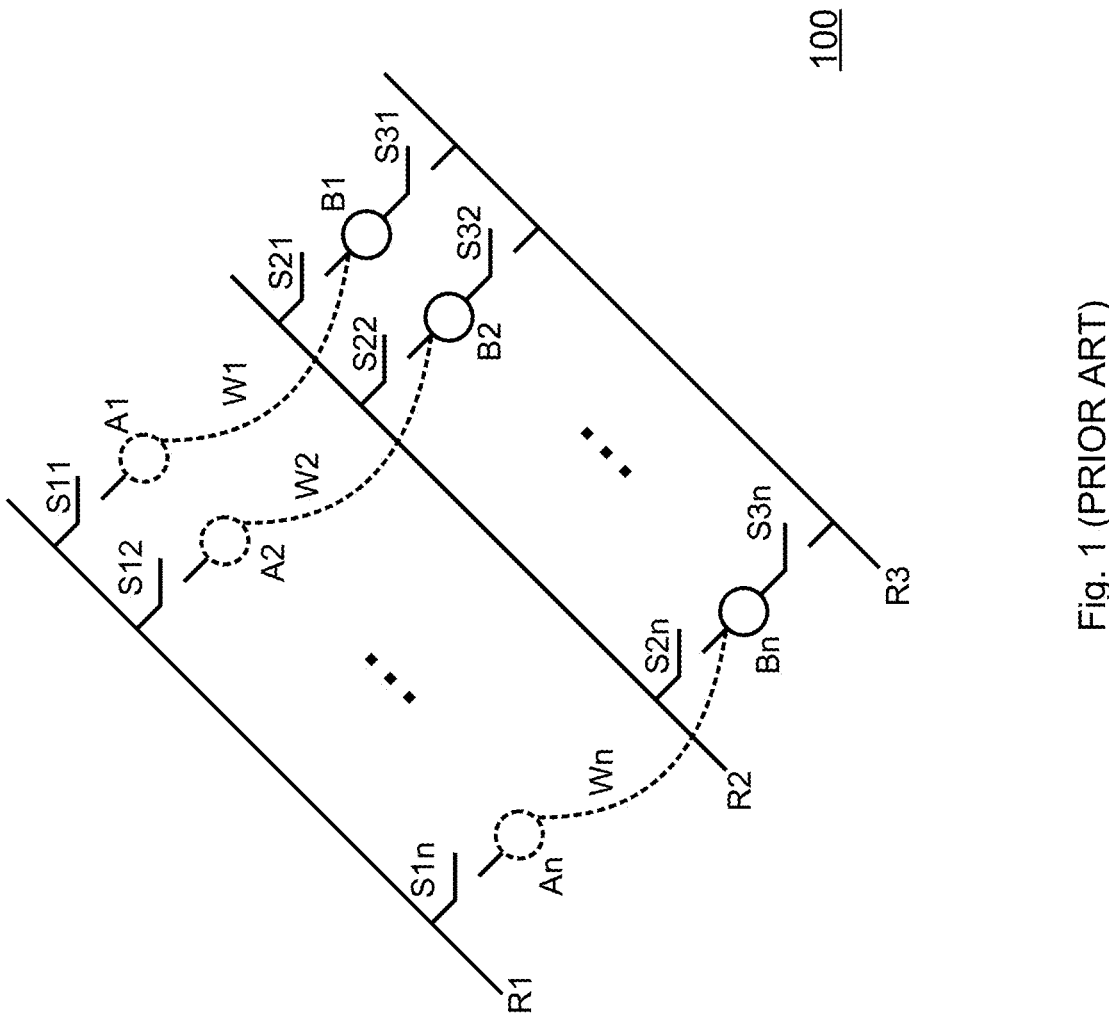
FIG. 1 shows a prior art antenna switch.
Figure 2A:
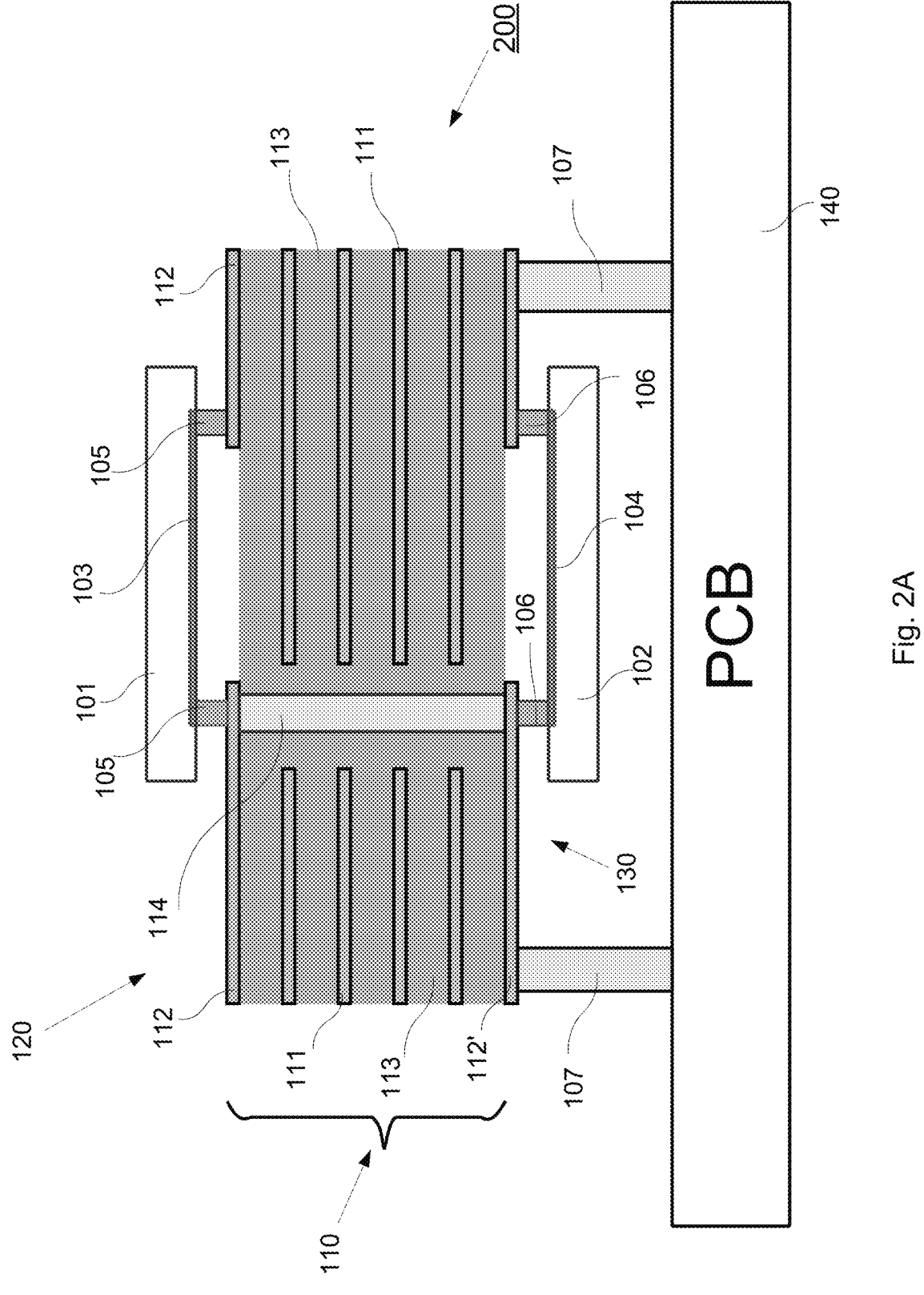
FIG. 2A shows a cross-sectional view of an example electronic module according to an embodiment of the present disclosure.

FIG. 2A shows a cross-section of an example electronic module (200) for use in RF front-end circuitry, having a double-sided laminate package according to an embodiment of the present disclosure. Electronic module (200) comprises a laminate (110) including dielectric (113) within which metal traces (111) are disposed. Laminate (110) comprises a first side (120), a second side (130), and first side and second side metal traces (112, 112') disposed on the first side (120) and the second side (130), respectively. Electronic module (200) further comprises a first IC (101) including IC metal (103) and electronic components (not shown), a second IC (102) having IC metal (104) and electronic components (not shown). First IC (101) is connected to first side metal trace (112) via IC bumps (105), and second IC (102) is connected to second side metal trace (112') via IC bumps (106).

With further reference to FIG. 2A, according to some embodiments in accordance with the present disclosure, one or more metal traces (e.g, metal traces 111) may serve as a shield/isolator between the first and the second IC (101, 102). Electronic module (200) also includes copper pillars (107) providing connections between laminate (110) and (PCB) printed circuit board (140). According to the teachings of the present disclosure, laminate (110) further comprises vias (114) connecting the first side and second side metal trances (112, 112') together, thereby providing electric coupling between the electronic components inside the first IC (101) and the electronic components inside the second IC (102).

Figure 2B:
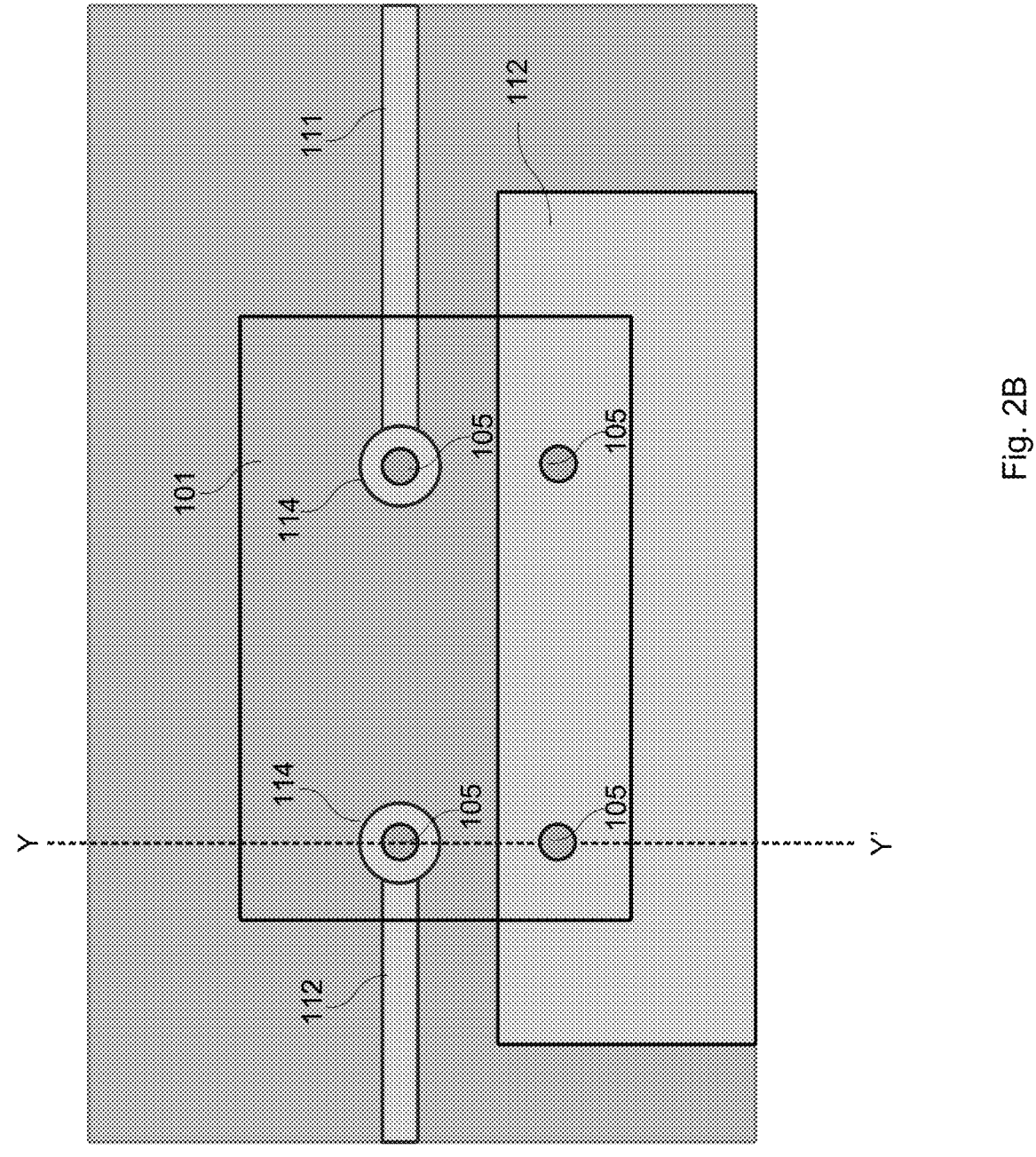
FIG. 2B shows a top-view of an example electronic module according to an embodiment of the present disclosure

FIG. 2B is a top view of the electronic module (200) of FIG. 2A. The cross section shown in FIG. 2A represents essentially a cross-section across axis (YY') shown in FIG. 2B. Like reference numbers in FIGS. 2A-2B represent the same elements on such Figures.

Referring back to FIG. 2A, it is appreciated that instead of having a complex planar layout with the drawbacks described previously, the electronic components in accordance with several embodiments of the present disclosure may be implemented in two different IC's positioned on the opposite sides of the laminate. The electric interconnection among components in the IC's can be established through vias disposed within the laminate. By virtue of such double-sided implementation, the layout routings are simpler and require less space on each side. As a result, the overall insertion loss and parasitic capacitances are improved due to shorter traces and lower coupling of adjacent elements within the circuits. In order to further highlight and clarify such benefits, in what follows, example implementations of the above-disclosed teachings are provided.

Figure 3A:
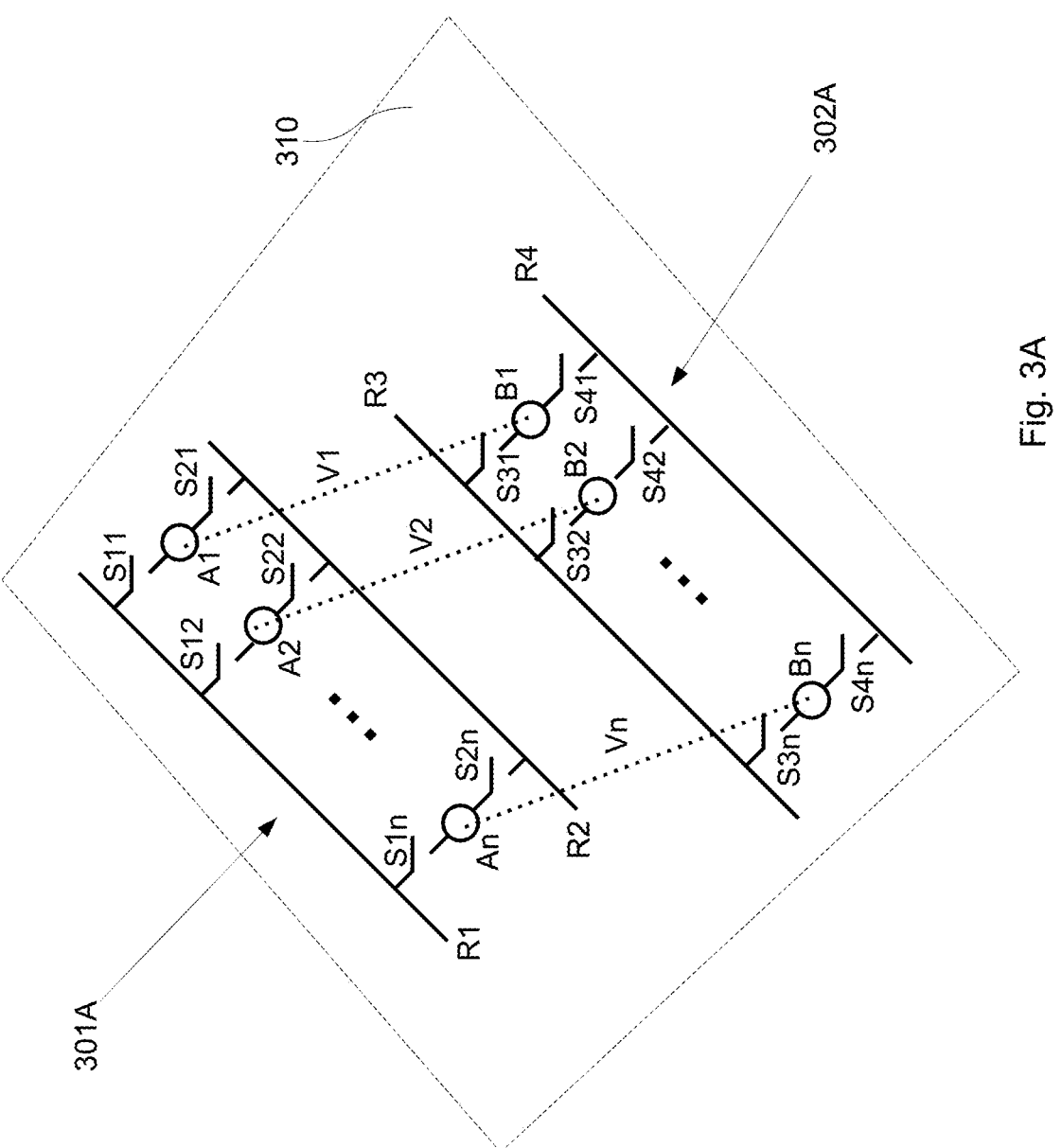
FIGS. 3A-3D are example implementations of the embodiment of FIG. 2A according to an embodiment of the present disclosure.

FIG. 3A shows an example implementation of electronic module (200) of FIG. 2A. First antenna switch (ASW) (301A) of FIG. 3A represents an example constituent of first IC (101) of FIG. 2A on a first (top) plane, and second ASW (302A) of FIG. 3A represents an example constituent of second IC (102) of FIG. 2A on a second (bottom) plane. Also shown in the embodiment of FIG. 3A is laminate (310) providing shielding between the planes of the two ASWs (301A, 302A).

With further reference to FIG. 3A, first ASW (301A) is a double-pole n-throw (DPnT) switch wherein antenna rail (R1) is coupled to IC bumps (A1, . . . , An) through switches (S11, . . . , S1n) and antenna rail (R2) is coupled to IC bumps (A1, . . . , An) through switches (S21, . . . , S2n). Similarly, ASW (302A) is a DPnT wherein antenna rail (R3) is coupled to IC bumps (B1, . . . , Bn) through switches (S31, . . . , S3n) and antenna rail (R4) is coupled to IC bumps (B1, . . . , Bn) through switches (S41, . . . , S4n). Additionally, vias (V1, . . . , Vn) disposed within laminate (310) provide interconnection between IC bumps (A1, . . . , An) and corresponding bumps (B1, . . . Bn). By virtue of implementing such three-dimensional connections through vias (V1, . . . , Vn), coupling of antenna rails on one side of laminate (310) with IC bumps disposed on the opposite side of the laminate is made possible.

With continued reference to FIG. 3A, three-dimensional connection using vias and in accordance with the disclosed teachings help also avoid a possible routing overlap of the antenna rails. The structure presented is similar to a coaxial cable (see also FIG. 2B), with an impedance that can be adjusted by controlling the size of the cutout region around the vias. As mentioned previously, the presence of laminate (310) provides the desired shielding between antenna switch poles disposed on the opposite sides of the laminate. In other words, laminate (310) provides shielding between antenna rails (R1, R2) and antenna rails (R3, R4). As such, the IC layout design should mainly address the isolation of antenna switch poles on the same plane/side such as antenna rail (R1) with reference to antenna rail (R2), and antenna rail (R3) with reference to antenna rail (R4). The three-dimensional double-side structure shown in the present disclosure provides also flexible IC bump allocation. IC bumps on the opposite side of laminate (310) can slide along corresponding antenna rails without the risk of coupling to each other. As an example, IC bumps on antenna rails (R1, R3) can have the same (x, y) coordinates since laminate (310) acts as shielding in between such rails. The same applies to antenna rails (R2, R4).

With regards to the overall performance requirements of electronic modules such as RF front-end electronic modules, disposing IC bumps in a straight line may not always be desirable in terms of, for example, insertion loss and parasitic capacitances throughout the circuits. I/O design may be customized, and IC bump arrangements other than straight lines may also be envisaged. In what follows, some example embodiments are described to further clarify this point.

Figure 3B:
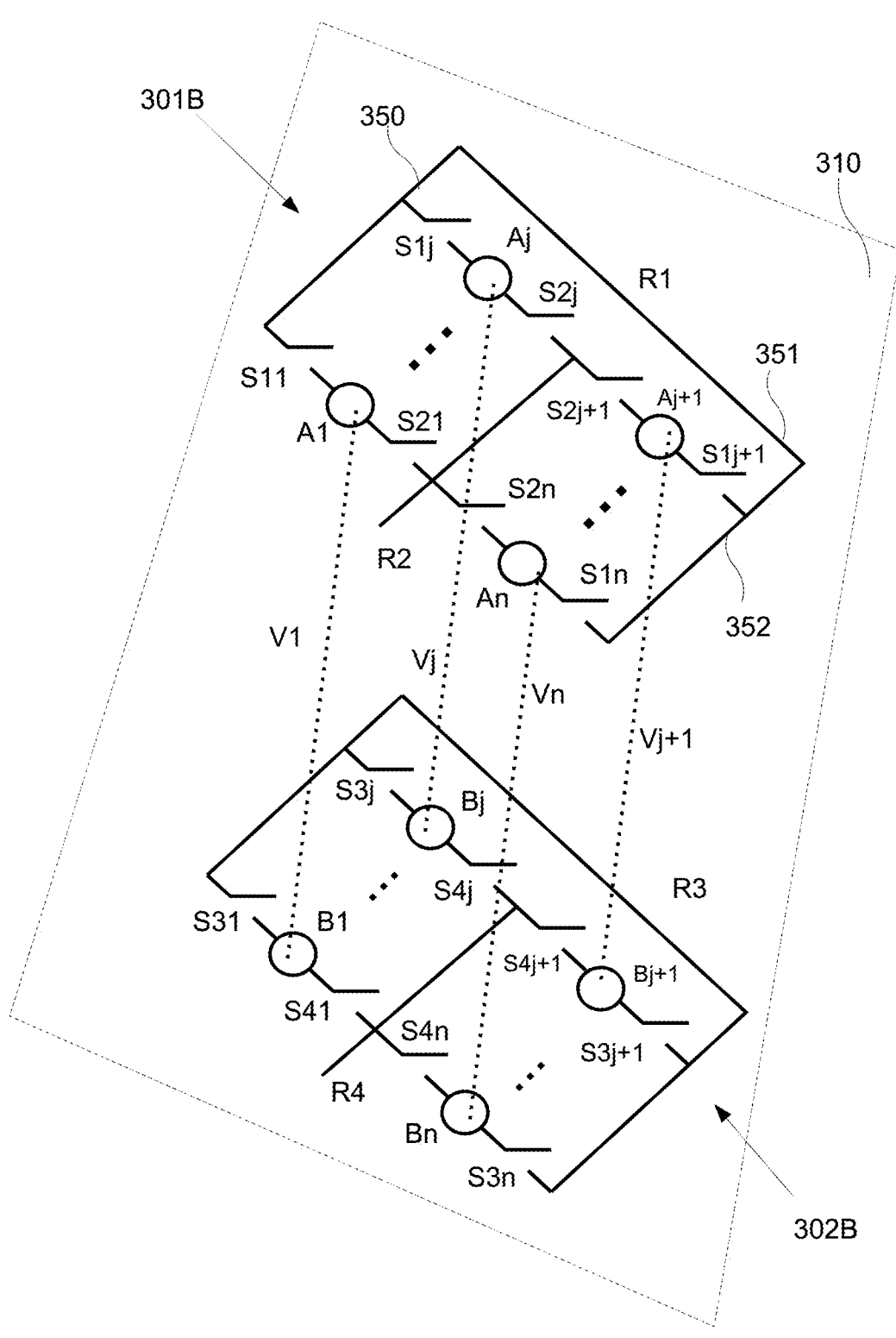

FIG. 3B shows an example implementation of electronic module (200) of FIG. 2A. First antenna switch (301B) of FIG. 3B represents an example constituent of first IC (101) of FIG. 2A, and second ASW (302B) of FIG. 3B represents an example constituent of second IC (102) of FIG. 2A. Also shown in the embodiment of FIG. 3B is laminate (310) providing shielding between the planes of the two ASWs (301B, 302B). Some of the vias, such as vias (V1, Vj, Vj+1, Vn) connecting IC bumps (A1, Aj, Aj+1, An) on one side of laminate (310) to corresponding IC bumps (B1, Bj, Bj+1, Bn) on the opposite side of laminate (310) are also shown.

With further reference to FIG. 3B, as can be noticed, the bump arrangement shown in this embodiment is different from the one shown in FIG. 3A. Rail (R1) of FIG. 3B forms an outer periphery of the ASW (301B) layout, and has three sections (350, 351, 352), each section having the shape of a straight line. Section (351) is in the middle of, and connecting sections (350, 352). On the other hand, rail (R2) has one section in the shape of a straight line. IC bumps (A1, . . . , An) are divided into a first IC bump subsets (A1, . . . , Aj) and a second IC bump subset (Aj+1, . . . , An). The bumps of the first IC bump subset (A1, . . . , Aj) are placed along a straight line alongside and in between rail (R2) and section (350) of rail (R1). The bumps of the second IC bump subset (Aj+1, . . . , An) are placed along a straight line, alongside and in between rail (R2) and section (352) of rail (R1). The switch arrangements are in correspondence with IC bumps arrangements. Switch (Sxy, x=1 or 2, y=1, . . . n) is served to couple rail (Rx, x=1 or 2) to IC bump (Ay, y=1, . . . , n). The arrangement of the IC bumps (B1, . . . , Bn) and antenna rails (R3, R4) is similar to what has just been described with regards their counterparts on the opposite side of laminate (310).

Figure 3C:
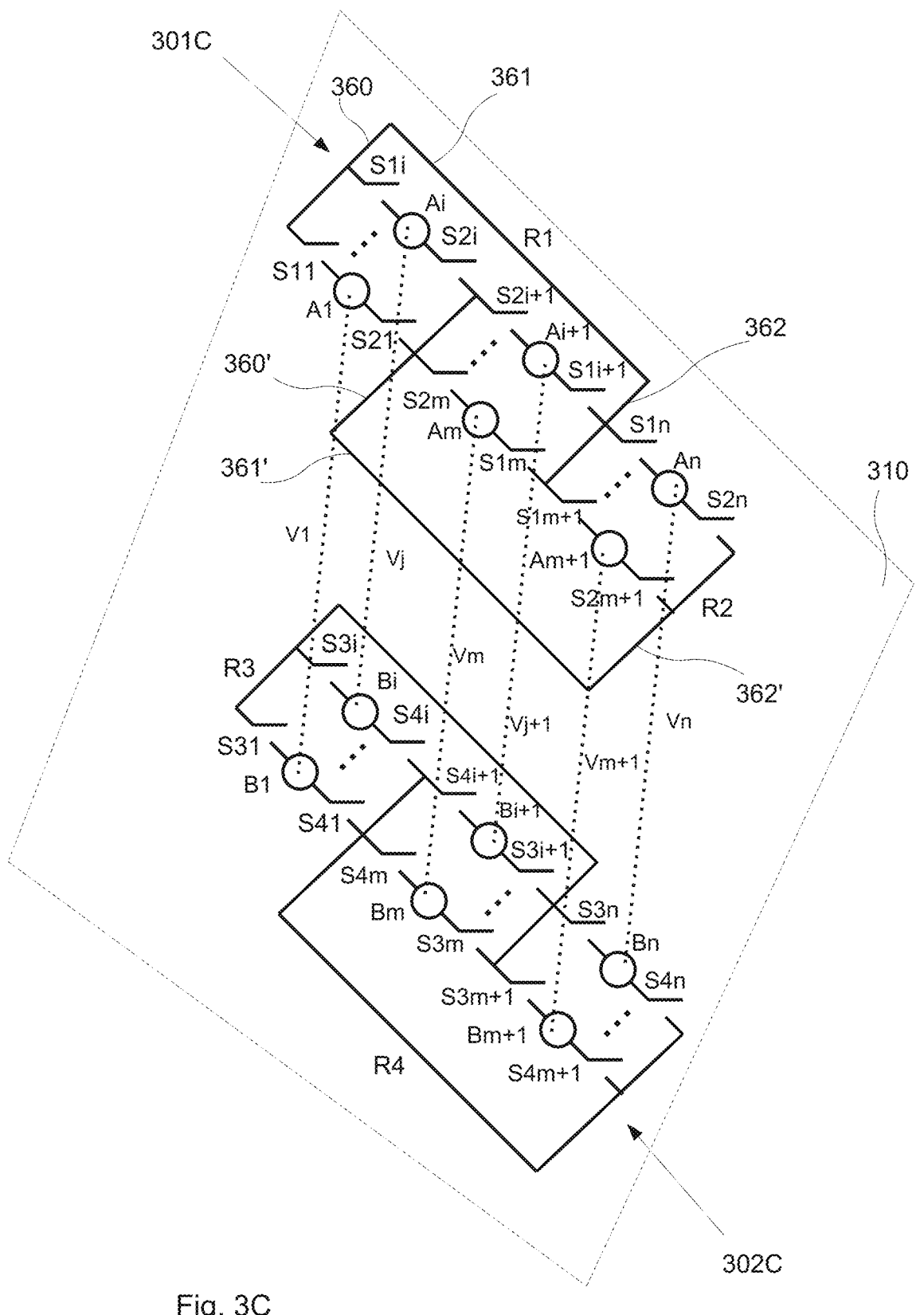

FIG. 3C shows an example implementation of electronic module (200) of FIG. 2A. First antenna switch (301C) of FIG. 3C represents an example constituent of first IC (101) of FIG. 2A, and second ASW (302C) of FIG. 3C represents an example constituent of second IC (102) of FIG. 2A. Also shown in the embodiment of FIG. 3C is laminate (310) providing shielding between the planes of the two ASWs (301B, 302B). Some of the vias, such as vias (V1, Vj, Vj+1, Vm, Vm+1, Vn) connecting IC bumps (A1, Aj, Aj+1, Am, Am+1, An) on one side of laminate (310) with corresponding IC bumps (B1, Bj, Bj+1, Bm, Bm+1, Bn) on the opposite side, are also shown.

With further reference to FIG. 3C, antenna rail (R1) has three sections (360, 361, 362), each section having the shape of a straight line. Section (361) is in the middle of, and connecting sections (360, 362). Similarly, antenna rail (R2) has three sections (360', 361', 362'), each section having the shape of a straight line. Section (361') is in the middle of, and connecting sections (360', 362'). IC bumps (A1, . . . , An) are divided into a first IC bump subsets (A1, . . . , Ai), a second IC bump subset (Ai+1, . . . , Am), and a third IC bump subset (Am+1, . . . , An). The bumps of the first IC bump subset (A1, . . . , Ai) are placed along a straight line, alongside and in between section (360) of rail (R1) and section (360') of rail (R2). The bumps of the second IC bump subset (Ai+1, . . . , Am) are placed along a straight line, alongside and in between section (360') of rail (R2) and section (362) of rail (R1). Third IC bump subset (Am+1, . . . , An) are placed along a straight line, alongside and in between section (362) of rail (R1) and section (362') of rail (R2). The switch arrangements are in correspondence with IC bumps arrangements. Switch (Sxy, x=1 or 2, y=1, . . . n) is served to couple rail (Rx, x=1 or 2) to IC bump (Ay, y=1, . . . , n). The arrangement of the IC bumps (B1, . . . , Bn) and antenna rails (R3, R4) is similar to what was described with regards their counterparts on the opposite side of laminate (310).

Figure 3D:
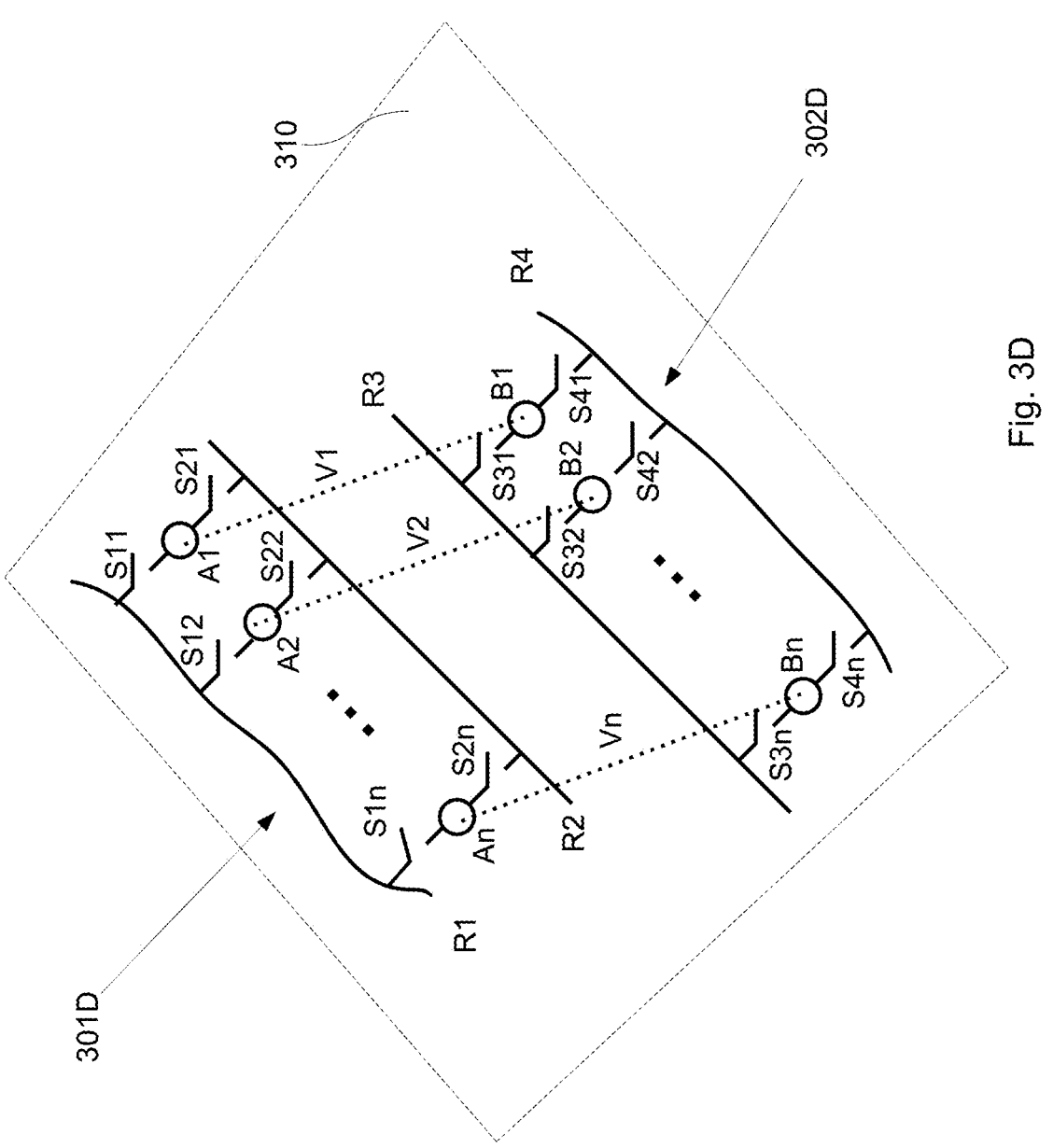

With reference to the embodiments of FIGS. 3A-3C, it will be appreciated that the antenna rails are of arbitrary shapes. Other embodiments with antenna rails of arbitrary curvy shapes different from straight lines may also be envisaged. FIG. 3D shows an example of such arbitrary curvy shapes (301D, 302D). Moreover, as an example, FIG. 3C, indicates symmetry or uniformity between ASWs (301C) and (302C) configuration and layout. Such symmetry or uniformity is optional and not a requirement.

As also described previously, the circuit layout in electronic modules can be simplified by dividing the electronic components, for example, in two different sets and implement them in two different ICs mounted on the opposite sides of a laminate. The interconnection among various components on the opposite sides of the laminate can be implemented using vias disposed inside the laminate.

Figure 4:
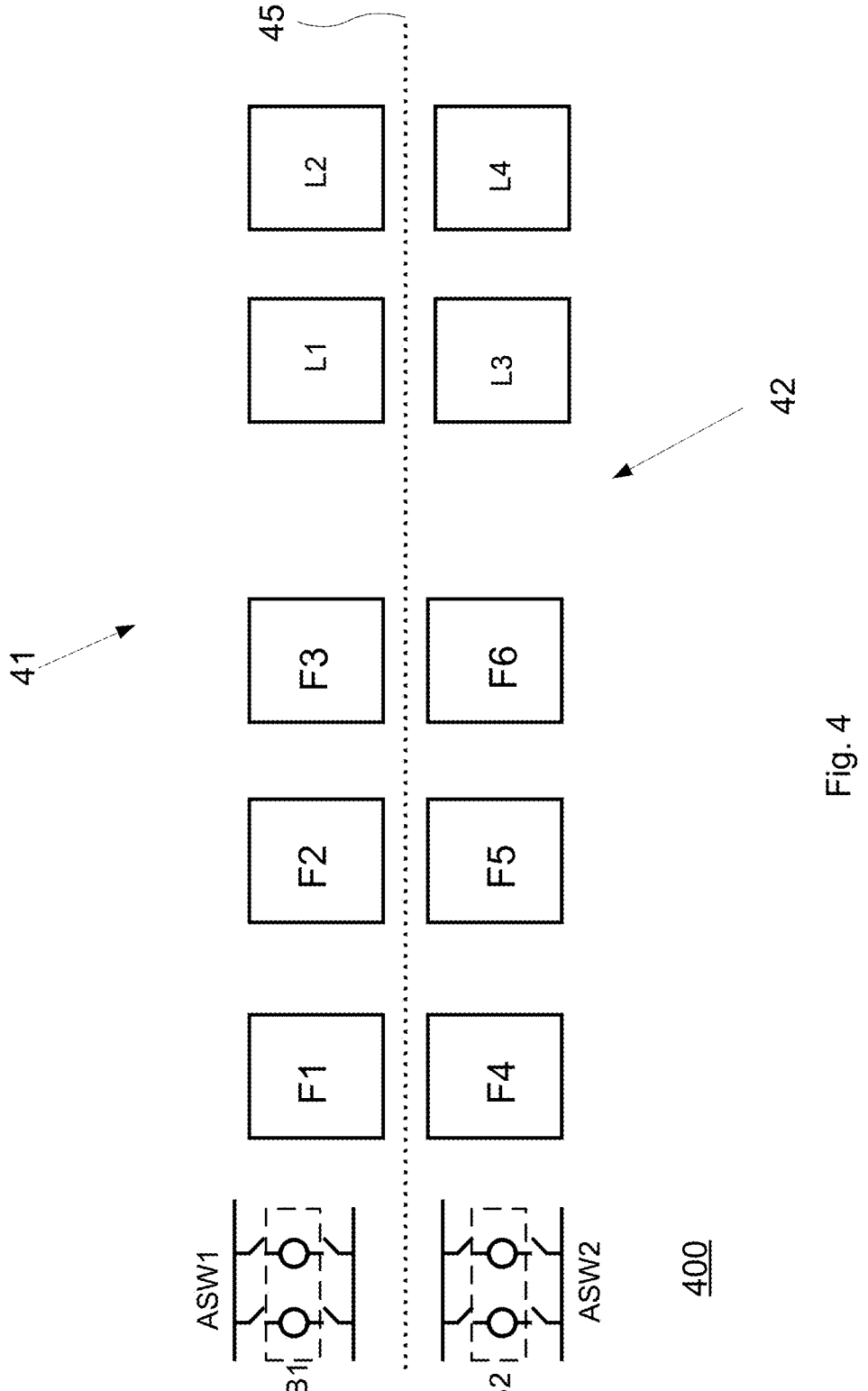
FIG. 4 shows an example implementation of FIG. 2A according to an embodiment of the present disclosure.

This is illustrated in FIG. 4 showing an example multi-band RF front-end (400) within an electronic module, such as an RF front-end, according to an embodiment of the present disclosure. RF front-end (400) includes band filter (F1, . . . . F6), (LNAs) low-noise amplifiers (L1, . . . , L4) and antenna switches (ASW1, ASW2). As shown, various components of such circuit can be divided into elements shown above and below line (45), to show placement along two different planes. As an example, the elements above the line can be implemented as part of a first IC and the elements below the line as part of a second IC. Similarly to what already described with regards to the embodiment of FIG. 2A, the ICs can be coupled to opposite sides of the laminate (not shown) using IC bumps (B1, B2). Additionally, and again, similarly to what is described with regards to the embodiment of FIG. 2A, various connections between the components on the opposite side of the laminate (components above and below line (45)) can be implemented by disposing vias throughout the laminate in accordance with the above-disclosed teachings.

As used in this disclosure, the term "radio frequency" (RF) refers to a rate of oscillation in the range of about 3 kHz to about 300 GHz. This term also includes complex signal waveforms that cover a range of frequencies, for example OFDM waveforms and others, which are commonly used in wireless and wired communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOS-FET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An electronic module comprising:
a laminate having a first side and a second side, the second side being opposite to the first side, the laminate being made of a dielectric material;
first side metal traces disposed on the first side of the laminate and second side metal traces disposed on the second side of the laminate;
a first integrated circuit (IC) comprising a plurality of first side IC bumps; the first IC being disposed along a first plane and coupled to the first side metal traces via the plurality of first side IC bumps;
a second IC comprising a plurality of second side IC bumps; the second IC being disposed along a second plane and coupled to the second side metal traces via the plurality of second side IC bumps; and
a plurality of vias disposed inside the laminate, wherein:
    each via of the plurality of vias connects a first side IC bump of the plurality of first side IC bumps to a corresponding second side IC bump of the plurality of second side IC bumps, and
    the first IC comprises a first side antenna switch and the second IC comprises a second side antenna switch.

2. The electronic module of claim 1, wherein the laminate further comprises internal metal traces.

3. The electronic module of claim 1, wherein each of the first and the second IC comprises a metal layer.

4. The electronic module of claim 1, mounted on a printed circuit board through copper pillars.

5. An electronic module comprising:
a laminate comprising a dielectric material;
first side metal traces disposed on a first side of the laminate;
second side metal traces disposed on a second side of the laminate;
a first integrated circuit (IC) comprising a plurality of first side IC bumps, the first IC being disposed along a first plane and coupled to the first side metal traces via the plurality of first side IC bumps;
a second IC comprising a plurality of second side IC bumps, the second IC being disposed along a second plane and coupled to the second side metal traces via the plurality of second side IC bumps; and
a plurality of vias disposed inside the laminate, wherein each via of the plurality of vias connects a first side IC bump of the plurality of first side IC bumps to a corresponding second side IC bump of the plurality of second side IC bumps; and wherein the first IC comprises a first side antenna switch and the second IC comprises a second side antenna switch.

6. The electronic module of claim 5, wherein:
the first side antenna switch comprises:
    a first antenna rail, and a second antenna rail;
    a first set of switches coupling the first antenna rail to a corresponding first side IC bump, and
    a second set of switches coupling the second antenna rail to a corresponding first side IC bump.

7. The electronic module of claim 6, wherein:
the second side antenna switch comprises:
    a third antenna rail, and a fourth antenna rail;
    a third set of switches coupling the third antenna rail to a corresponding second side IC bump, and
    a fourth set of switches coupling the fourth antenna rail to a corresponding second side IC bump.

8. The electronic module of claim 7, wherein each of the antenna rails has a shape of a straight line.

9. The electronic module of claim 8, wherein the first side IC bumps are arranged in a straight line and disposed in between the first and the second antenna rails.

10. The electronic module of claim 9, wherein the second side IC bumps are arranged in a straight line and disposed in between the third and the fourth antenna rails.

11. The electronic module of claim 7, wherein:
each of the first and the third antenna rails comprises a first, a second, and a third section;
the second section of the first antenna rails connects the first section of the first antenna rail to the third section of the first antenna rail;
the second section of the third antenna rails connects the first section of the third antenna rail to the third section of the third antenna rail;
the first side IC bumps comprise a first bump subset and a second bump subset;
bumps of the first bump subset are disposed in a straight line in between the first section of the first antenna rail and the second antenna rail;
bumps of the second bump subset are disposed in a straight line in between the second antenna rail and the third section of the first antenna rail;
the second side IC bumps comprise a third bump subset and a fourth bump subset;
bumps of the third bump subset are disposed in a straight line in between the first section of the third antenna rail and the fourth antenna rail;
bumps of the fourth bump subset are disposed in a straight line in between the fourth antenna rail and the third section of the third antenna rail.

12. The electronic module of claim 7, wherein:
each of the first and the third antenna rails comprises a first, a second, and a third section;
the second section of each of the antenna rails connects the first section of the each of the antenna rails to the third section of the same antenna rail;
the first side IC bumps comprises a first, a second, and a third set of IC bumps;
IC bumps of the first set of IC bumps are disposed in a straight line in between the first section of the first antenna rail and the first section of the second antenna rail;
IC bumps of the second set of IC bumps are disposed in a straight line in between the third section of the first antenna rail and the first section of the second antenna rail;

IC bumps of the third set of IC bumps are disposed in a straight line in between the third section of the first antenna rail and the third section of the second antenna rail.

13. The electronic module of claim 12, wherein:

the second side IC bumps comprises a fourth, a fifth, and a sixth set of IC bumps;

IC bumps of the fourth set of IC bumps are disposed in a straight line in between the first section of the third antenna rail and the first section of the fourth antenna rail;

IC bumps of the fifth set of IC bumps are disposed in a straight line in between the third section of the third antenna rail and the first section of the fourth antenna rail;

IC bumps of the sixth set of IC bumps are disposed in a straight line in between the third section of the third antenna rail and the third section of the fourth antenna rail.

14. A radio frequency (RF) front-end module comprising a laminate having a first side and a second side, the second side being opposite to the first side, the laminate being made of a dielectric material;

first side metal traces disposed on the first side of the laminate and second side metal traces disposed on the second side of the laminate;

a first integrated circuit (IC) comprising a plurality of first side IC bumps; the first IC being disposed along a first plane and coupled to the first side metal traces via the plurality of first side IC bumps;

a second IC comprising a plurality of second side IC bumps; the second IC being disposed along a second plane and coupled to the second side metal traces via the plurality of second side IC bumps; and a plurality of vias disposed inside the laminate, wherein:

each via of the plurality of vias connects a first side IC bump of the plurality of first side IC bumps to a corresponding second side IC bump of the plurality of second side IC bumps.

15. The electronic module of claim 1, wherein:

the first side antenna switch comprises:

a first antenna rail, and a second antenna rail;

a first set of switches coupling the first antenna rail to a corresponding first side IC bump, and a second set of switches coupling the second antenna rail to a corresponding first side IC bump.

16. The electronic module of claim 15, wherein:

the second side antenna switch comprises:

a third antenna rail, and a fourth antenna rail;

a third set of switches coupling the third antenna rail to a corresponding second side IC bump, and a fourth set of switches coupling the fourth antenna rail to a corresponding second side IC bump.

17. The electronic module of claim 16, wherein each of the antenna rails has a shape of a straight line.

18. The electronic module of claim 17, wherein the first side IC bumps are arranged in a straight line and disposed in between the first and the second antenna rails.

19. The electronic module of claim 17, wherein the second side IC bumps are arranged in a straight line and disposed in between the third and the fourth antenna rails.

20. The electronic module of claim 16, wherein:

each of the first and the third antenna rails comprises a first, a second, and a third section;

the second section of the first antenna rails connects the first section of the first antenna rail to the third section of the first antenna rail;

the second section of the third antenna rails connects the first section of the third antenna rail to the third section of the third antenna rail;

the first side IC bumps comprise a first bump subset and a second bump subset;

bumps of the first bump subset are disposed in a straight line in between the first section of the first antenna rail and the second antenna rail;

bumps of the second bump subset are disposed in a straight line in between the second antenna rail and the third section of the first antenna rail;

the second side IC bumps comprise a third bump subset and a fourth bump subset;

bumps of the third bump subset are disposed in a straight line in between the first section of the third antenna rail and the fourth antenna rail;

bumps of the fourth bump subset are disposed in a straight line in between the fourth antenna rail and the third section of the third antenna rail.

21. The electronic module of claim 16, wherein:

each of the first and the third antenna rails comprises a first, a second, and a third section;

the second section of each of the antenna rails connects the first section of the each of the antenna rails to the third section of the same antenna rail;

the first side IC bumps comprises a first, a second, and a third set of IC bumps;

IC bumps of the first set of IC bumps are disposed in a straight line in between the first section of the first antenna rail and the first section of the second antenna rail;

IC bumps of the second set of IC bumps are disposed in a straight line in between the third section of the first antenna rail and the first section of the second antenna rail;

IC bumps of the third set of IC bumps are disposed in a straight line in between the third section of the first antenna rail and the third section of the second antenna rail.

22. The electronic module of claim 21, wherein:

the second side IC bumps comprises a fourth, a fifth, and a sixth set of IC bumps;

IC bumps of the fourth set of IC bumps are disposed in a straight line in between the first section of the third antenna rail and the first section of the fourth antenna rail;

IC bumps of the fifth set of IC bumps are disposed in a straight line in between the third section of the third antenna rail and the first section of the fourth antenna rail; and IC bumps of the sixth set of IC bumps are disposed in a straight line in between the third section of the third antenna rail and the third section of the fourth antenna rail.

* * * * *